United States Patent
Lu et al.

(10) Patent No.: US 9,524,765 B2
(45) Date of Patent: Dec. 20, 2016

(54) DIFFERENTIAL MAGNETIC TUNNEL JUNCTION PAIR INCLUDING A SENSE LAYER WITH A HIGH COERCIVITY PORTION

(71) Applicant: QUALCOMM Incorporated, San Diego, CA (US)

(72) Inventors: Yu Lu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/460,626

(22) Filed: Aug. 15, 2014

(65) Prior Publication Data
US 2016/0049185 A1   Feb. 18, 2016

(51) Int. Cl.
*G11C 11/16* (2006.01)
*H01L 27/22* (2006.01)
*G11C 7/24* (2006.01)

(52) U.S. Cl.
CPC ............ *G11C 11/1673* (2013.01); *G11C 11/16* (2013.01); *G11C 11/161* (2013.01); *G11C 11/1659* (2013.01); *G11C 11/1695* (2013.01); *H01L 27/228* (2013.01); *G11C 7/24* (2013.01); *G11C 11/165* (2013.01); *G11C 11/1675* (2013.01); *G11C 2213/78* (2013.01)

(58) Field of Classification Search
CPC .................................................... G11C 11/16
USPC ......................................................... 365/158
See application file for complete search history.

(56) References Cited

U.S. PATENT DOCUMENTS

| | | | |
|---|---|---|---|
| 6,052,263 A | 4/2000 | Gill | |
| 6,963,098 B2 | 11/2005 | Daughton et al. | |
| 7,411,817 B2 | 8/2008 | Nozieres et al. | |
| 7,518,897 B2 * | 4/2009 | Nozieres | G11C 11/16 365/173 |
| 8,023,299 B1 * | 9/2011 | Gharia | 365/49.1 |
| 8,228,702 B2 * | 7/2012 | Javerliac et al. | 365/49.1 |
| 8,228,716 B2 | 7/2012 | Nozieres et al. | |
| 8,385,107 B2 * | 2/2013 | Prejbeanu | 365/158 |
| 8,467,234 B2 | 6/2013 | Berger et al. | |
| 8,611,140 B2 | 12/2013 | El Baraji et al. | |
| 8,964,458 B2 * | 2/2015 | Lin et al. | 365/158 |
| 2002/0140000 A1 * | 10/2002 | Watanabe | 257/200 |
| 2011/0013448 A1 | 1/2011 | Nozieres et al. | |
| 2011/0292718 A1 * | 12/2011 | Suzuki et al. | 365/158 |
| 2012/0267733 A1 | 10/2012 | Hu et al. | |
| 2013/0094283 A1 | 4/2013 | Berger et al. | |

(Continued)

FOREIGN PATENT DOCUMENTS

WO    2014089182 A1    6/2014

OTHER PUBLICATIONS

Garcia, F. et al., "Large anomalous enhancement of perpendicular exchange bias by introduction of a nonmagnetic spacer between the ferromagnetic and antiferromagnetic layers," Applied Physics Letters, Oct. 27, 2003, vol. 83, No. 17, pp. 3537-3539.

(Continued)

*Primary Examiner* — Son Mai
(74) *Attorney, Agent, or Firm* — Toler Law Group, PC

(57) ABSTRACT

An apparatus includes a first magnetic tunnel junction (MTJ) device of a differential MTJ pair. The apparatus further includes a second MTJ device of the differential MTJ pair. The first MTJ device includes a sense layer having a high coercivity portion.

30 Claims, 9 Drawing Sheets

(56) References Cited

U.S. PATENT DOCUMENTS

| | | |
|---|---|---|
| 2013/0201757 A1 | 8/2013 | Li et al. |
| 2013/0272059 A1* | 10/2013 | Lin ........................ G11C 11/161 |
| | | 365/158 |
| 2014/0071740 A1* | 3/2014 | Kim ..................... G11C 11/1675 |
| | | 365/158 |
| 2014/0204661 A1* | 7/2014 | Doyle ...................... H01L 43/08 |
| | | 365/158 |
| 2014/0226396 A1 | 8/2014 | Subramanian et al. |
| 2014/0301135 A1* | 10/2014 | Guo .............................. 365/158 |

OTHER PUBLICATIONS

Prejbeanu, I.L. et al., "Scalability and logic functionalities of TA-MRAMs," New Circuits and Systems Conference (NEWCAS), 2013 IEEE 11th International, Jun. 16-19, 2013, pp. 1-4.

Prejbeanu, I.L. et al., "Thermally assisted MRAMs: ultimate scalability and logic functionalities," IOP Publishing, Journal of Physics D: Applied Physics, Jan. 31, 2013, vol. 46, No. 7, pp. 1-16.

Prejbeanu, I.L. et al., "Thermally assisted MRAM," Journal of Physics: Condensed Matter, Apr. 6, 2007, vol. 19, No. 16, IOP Publishing, Bristol, England, pp. 1-26.

Herault, J. et al., "Nanosecond magnetic switching of ferromagnet-antiferromagnet bilayers in thermally assisted magnetic random access memory," Journal of Applied Physics, Jul. 2009, vol. 106, Issue 1, American Institute of Physics, College Park, Maryland, pp. 014505-014505-3. [Abstract retrieved from ieeexplore.ieee.org on Jul. 23, 2014].

International Search Report and Written Opinion—PCT/US2015/042079—ISA/EPO—Nov. 10, 2015.

\* cited by examiner ed in sense
DIFFERENTIAL MAGNETIC TUNNEL JUNCTION PAIR INCLUDING A SENSE LAYER WITH A HIGH COERCIVITY PORTION

I. FIELD

The present disclosure is generally related to memory devices and more particularly to magnetoresistive memory devices.

II. DESCRIPTION OF RELATED ART

An electronic device may include a memory that stores information, such as instructions, user data, and other information. For example, an electronic device may include a magnetoresistive random access memory (MRAM) device. An MRAM device may include multiple magnetic tunnel junction (MTJ) elements, each having a state (e.g., a magnetoresistance) that can be adjusted. The state may be adjusted by applying a current through the MTJ to modify a magnetic property of the MTJ.

In certain applications, an MTJ may have a reference configuration that provides a reference magnetic orientation of the MTJ. For example, a spin-torque transfer MRAM (STT-MRAM) device may include an MTJ having a storage layer, a reference layer having a fixed magnetic orientation, and a tunnel barrier between the storage layer and the reference layer. The reference layer may be used to read and write states at the storage layer using a spin-torque effect. For example, based on a relative orientation of the storage layer and the reference layer, a switching current applied through the MTJ may cause electrons to tunnel from the reference layer to the storage layer via a spin-torque effect, altering a magnetic state of the MTJ.

In other applications, an MTJ may be self-referenced. For example, a self-referenced thermal-assisted switching MRAM (TAS-MRAM) device may include an MTJ that has a storage layer that stores a state. The MTJ may further include a sense layer that changes states during operation (or "self-referencing") of the MTJ. Writing a state to the MTJ may include applying a current through the MTJ to heat the MTJ. Heating the MTJ may enable a reduced switching current to adjust a state of the MTJ. After the MTJ cools, the state is less susceptible to electromagnetic noise and other signals that can change a state of an MTJ. Because the sense layer does not have a fixed magnetic orientation in a self-referenced TAS-MRAM device, a sense operation at the TAS-MRAM device may include performing multiple operations to set the sense layer to known orientations while determining the orientation of the storage layer. For example, to determine the state of the storage layer, a first magnetoresistance of the MTJ may be measured while the sense layer has a first state. The sense layer may then be set (or "toggled") to a second state, and a second magnetoresistance of the MTJ may be measured while the sense layer has the second state. A bit value stored by the MTJ may be determined based on whether the first magnetoresistance is greater than or less than the second magnetoresistance.

Read operations at a TAS-MRAM device may consume more power than read operations at an STT-MRAM device. For example, sensing a state at an MTJ of an STT-MRAM device using a spin-torque transfer effect may consume less power than repeatedly setting a magnetic state of a sense layer during self-referencing of an MTJ of a TAS-MRAM device. However, a TAS-MRAM device may store data more reliably than an STT-MRAM device (since for example a TAS-MRAM device may be less susceptible to noise while the TAS MTJ is cooled or "frozen" in a state).

III. SUMMARY

A device may include a differential magnetic tunnel junction (MTJ) pair having a first MTJ and a second MTJ that store a value. To read the value, magnetoresistances of the MTJs may be sensed and compared. Mapping a single bit value to the MTJs may enable a high coercivity material (or a magnetically "hard" material) to be included in sense layers of the MTJ devices (because states of the sense layers need not be "toggled" during read operations as in certain conventional self-referenced MTJs). Including the high coercivity material in sense layers may improve operation of an MTJ device, such as by enhancing reliability of the MTJ device by increasing stability of a sense layer. Further, read operation latency may be reduced by avoiding "toggling" of a sense layer during a read operation as in certain conventional self-referenced MTJ devices. In an illustrative implementation, the differential MTJ pair is implemented within a thermal-assisted switching (TAS) spin-torque transfer (STT) magnetoresistive random access memory (TAS-STT-MRAM) device that utilizes both STT and TAS effects to store information at the differential MTJ pair.

In a particular embodiment, an apparatus includes a first magnetic tunnel junction (MTJ) device of a differential MTJ pair. The apparatus further includes a second MTJ device of the differential MTJ pair. The first MTJ device includes a sense layer having a high coercivity portion.

In another particular embodiment, a method includes initiating a sense operation to determine a first state of a first magnetic tunnel junction (MTJ) device and a second state of a second MTJ device. Initiating the sense operation includes generating a current though a sense layer of the first MTJ device; the sense layer includes a high coercivity portion. The method further includes comparing the first state and the second state to determine a value associated with the first MTJ device and the second MTJ device.

In another particular embodiment, an apparatus includes means for storing a first magnetic state of a differential magnetic tunnel junction (MTJ) pair and means for storing a second magnetic state of the differential MTJ pair. The means for storing the first magnetic state includes a sense layer having a high coercivity portion.

In another particular embodiment, a magnetoresistive random access memory (MRAM) device includes a plurality of differential MTJ pairs. The plurality of differential MTJ pairs includes a differential MTJ pair having a sense layer that includes a high coercivity portion. The MRAM device further includes a reference device. The reference device is configured to store a sample state to enable data recovery in response to exposure of the MRAM device to a strong magnetic field.

In another particular embodiment, a computer-readable medium stores instructions that are executable by a processor. The computer-readable medium includes a first magnetic tunnel junction (MTJ) device of a differential MTJ pair and a second magnetic tunnel junction (MTJ) device of the differential MTJ pair. The first MTJ device includes a sense layer having a high coercivity portion.

One particular advantage provided by at least one of the disclosed embodiments is that storing a single value at a differential MTJ pair may enable a sense layer to include "hard" magnetic materials because the magnetic states need not switch or "toggle" during operation of the differential MTJ pair. In this case, operation of the differential MTJ pair differs from a conventional self-referenced device because a sense layer may have a "fixed" magnetic state instead of a configurable magnetic state. The fixed magnetic state may enable STT operation at the differential MTJ pair (because spin-torque may depend on the relative direction of the magnetic states and may be incompatible with conventional self-referenced TAS-MRAM designs). Including a hard magnetic material in a sense layer may enable STT operation at an MTJ device (e.g., by enabling tunneling between the sense layer and a storage layer of the MTJ device). The MTJ device may further include an antiferromagnetic (AFM) material that enables TAS operation of the MTJ device. Accordingly, the differential MTJ pair may enable both STT and TAS operation at an MRAM device. The differential MTJ pair therefore may enable low power STT operation while also achieving stability/reliability associated with TAS designs. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
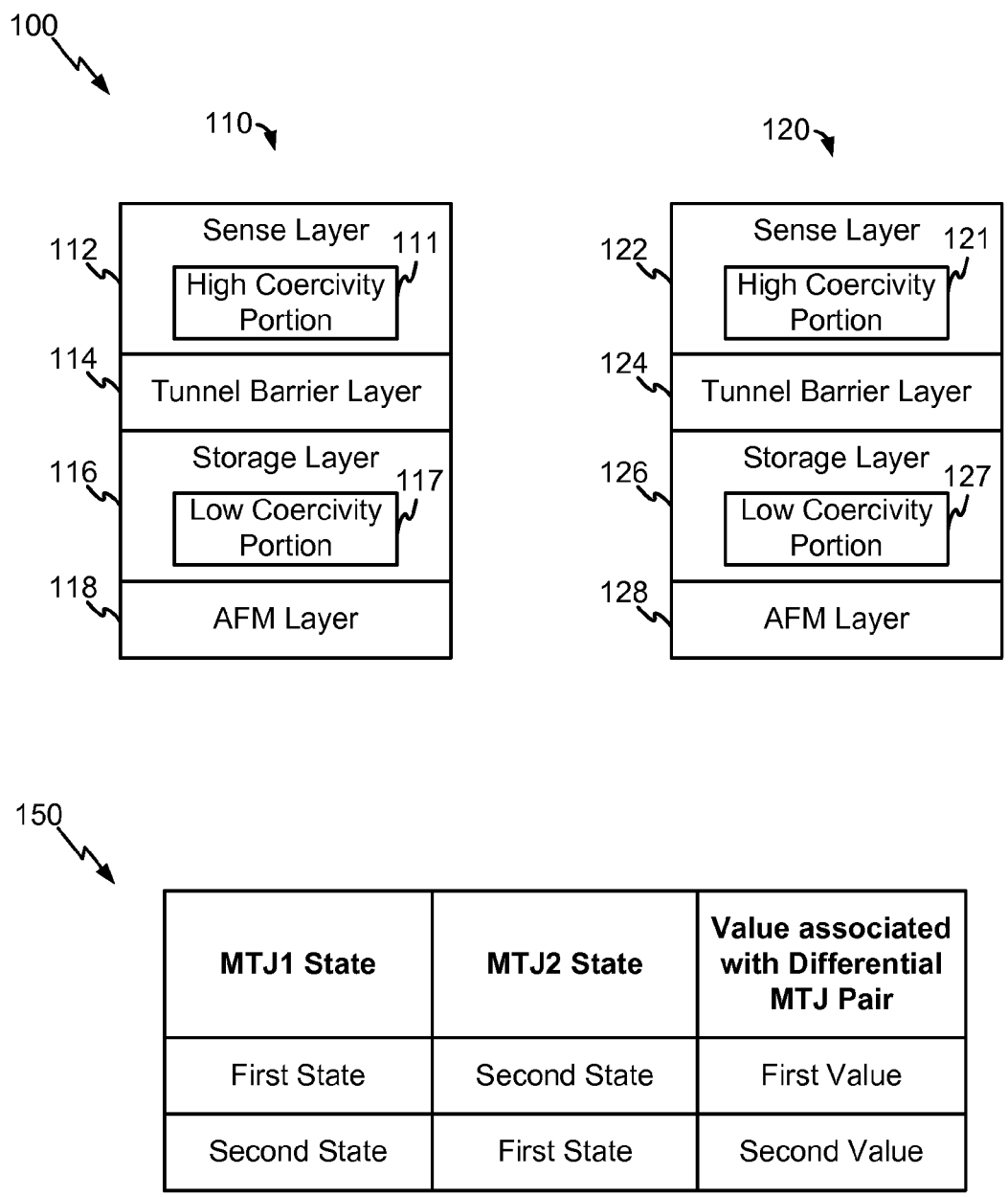
FIG. 1 is a block diagram of a particular illustrative embodiment of a differential magnetic tunnel junction (MTJ) pair and illustrates a table indicating example values associated with the differential MTJ pair.

FIG. 1 illustrates a differential magnetic tunnel junction (MTJ) pair 100. The differential MTJ pair 100 includes an MTJ device 110 and an MTJ device 120. The MTJ device 110 includes a sense layer 112, a tunnel barrier layer 114, a storage layer 116, and an antiferromagnetic (AFM) layer 118. The MTJ device 120 includes a sense layer 122, a tunnel barrier layer 124, a storage layer 126, and an AFM layer 128.

The sense layers 112, 122 may have "fixed" magnetic states having a common (e.g., parallel) orientation. For example, the sense layers 112, 122 may include "hard" magnetic materials, such as high coercivity portions 111, 121. In an illustrative example, the high coercivity portions 111, 121 each have a coercivity of greater than 1000 oersted (Oe). In an illustrative implementation, the high coercivity portions 111, 121 include a cobalt/iron/boron (Co/Fe/B) material, such a cobalt-iron alloy doped with boron. A Co/Fe/B material may have a coercivity of between 2000-3000 Oe. The high coercivity portions 111, 121 may each include a synthetic antiferromagnet (SAF) device.

The tunnel barrier layers 114, 124 may be configured to enable spin-torque transfer (STT) operation at the differential MTJ pair 100 (e.g., using a tunneling effect). The tunnel barrier layers 114, 124 may include an oxide material, such as magnesium oxide and/or aluminum oxide, as illustrative examples.

The storage layers 116, 126 may include "soft" magnetic materials, such as low coercivity portions 117, 127. To illustrate, the low coercivity portions may each have a coercivity of less than 100 Oe (e.g., 99 Oe or less, 5 Oe or less, 1 Oe or less, etc.). The low coercivity portions 117, 127 may include one or more materials that are magnetically "soft" to enable switching of magnetic states of the storage layers 116, 126. In an illustrative implementation, the low coercivity portions 117, 127 include an iron/nickel (Fe/Ni) material, such as a permalloy material.

The AFM layers 118, 128 may enable thermal-assisted switching operation of the differential MTJ pair 100, such as by causing an "exchange bias" of the storage layers 116, 126. The AFM layers 118, 128 may include one or more AFM materials. In a thermal-assisted switching magnetoresistive random access memory (TAS-MRAM) implementation of the differential MTJ pair 100, an AFM material may be selected to enable a particular blocking temperature associated with the MTJ devices 110, 120. For example, to enable a blocking temperature of approximately 200 degrees Celsius (° C.), the AFM layers 118, 128 may include an iridium/manganese (Ir/Mn) alloy material. As another example, to enable a blocking temperature of approximately 150° C., the AFM layers 118, 128 may include an iron/manganese (Fe/Mn) alloy material.

During operation of the differential MTJ pair 100, a write operation may be initiated to write a value at the differential MTJ pair 100. To initiate the write operation, complementary write currents may be applied to the MTJ devices 110, 120. To illustrate, a first write current may be applied to the MTJ device 110, and a second write current may be applied to the MTJ device 120. The first write current and the second write current may have complementary directions. For example, the first write current may be conducted from the sense layer 112 to the AFM layer 118, and the second write current may be conducted from the AFM layer 128 to the sense layer 122 (or vice versa). In a thermal-assisted switching (TAS) implementation, the first write current and the second write current may have magnitudes that satisfy a threshold for heating the AFM layers 118, 128 to enable switching of the magnetic states of the storage layers 116, 126, such as by increasing a temperature at the AFM layers 118, 128 to exceed "blocking" temperatures associated with the AFM layers 118, 128. In this case, the first magnetic state of the storage layer 116 and the second magnetic state of the storage layer 126 may be "frozen" upon ceasing application of the first write current and the second write current to the MTJ devices 110, 120.

The first write current may generate either a first state (e.g., a low magnetoresistance) at the MTJ device 110 or a second state (e.g., a high magnetoresistance) at the MTJ device 110. To illustrate, the first write current may have a particular magnitude and/or direction that generates the first state by setting the magnetic orientation of the storage layer 116 to be parallel to the magnetic orientation of the sense layer 112, resulting in a low magnetoresistance at the MTJ device 110. Alternatively, the first write current may have another magnitude and/or direction that generates the second state by setting the magnetic orientation of the storage layer 116 to be anti-parallel to the magnetic orientation of the sense layer 112, resulting in a high magnetoresistance at the MTJ device 110.

The second write current may generate either the first state or the second state at the MTJ device 110. To illustrate, the second write current may generate the first state by setting the magnetic orientation of the storage layer 126 to be parallel to the magnetic orientation of the sense layer 122, resulting in a low magnetoresistance at the MTJ device 120. Alternatively, the first write current may generate the second state by setting the magnetic orientation of the storage layer 126 to be anti-parallel to the magnetic orientation of the sense layer 122, resulting in a high magnetoresistance at the MTJ device 120.

A value associated with the differential MTJ pair 100 may be determined during a read operation at the differential MTJ pair 100. To illustrate, read currents may be generated at the MTJ devices 110, 120 (e.g., by control circuitry of a device that includes the differential MTJ pair 100) to determine states (e.g., magnetoresistances) of the MTJ devices 110, 120, and the states may be compared. In a thermal-assisted switching (TAS) implementation of the differential MTJ pair 100, the read currents may have magnitudes that do not satisfy the threshold for heating the AFM layers 118, 128 (e.g., to avoid switching the magnetic states of the storage layers 116, 126 during the read operation). A greater magnetoresistance of the MTJ device 120 relative to a magnetoresistance of the MTJ device 110 may indicate a first value associated with the differential MTJ pair. A greater magnetoresistance of the MTJ device 110 relative to a magnetoresistance of the MTJ device 120 may indicate a second value associated with the differential MTJ pair.

To further illustrate, FIG. 1 depicts a table 150. The table 150 indicates that a single value (e.g., a logical "0" value or a logical "1" value) may be written to and read from the differential MTJ pair 100 using complementary states of the MTJ devices 110, 120. For example, the table 150 indicates that the differential MTJ pair 100 is associated with a first value (e.g., a logical "0" value) if the MTJ device 110 has a first state (e.g., a low magnetoresistance) and if the MTJ device 120 has a second state (e.g., a high magnetoresistance). The table 150 further indicates that the differential MTJ pair 100 is associated with a second value (e.g., a logical "1" value) if the MTJ device 120 has the first state (e.g., a high magnetoresistance) and if the MTJ device 110 has the second state (e.g., a low magnetoresistance).

In an illustrative implementation, the differential MTJ pair 100 of FIG. 1 may enable TAS operation while also facilitating STT operation. For example, storing a single value at the differential MTJ pair 100 may enable the sense layers 112, 122 to include "hard" magnetic materials (e.g., the high coercivity portions 111, 121) because magnetic states of the sense layers 112, 122 need not switch or "toggle" during operation of the differential MTJ pair 100. In this example, operation of the differential MTJ pair 100 differs from a conventional self-referenced TAS-MRAM device because the sense layers 112, 122 may have "fixed" magnetic states (e.g., may include high coercivity materials or "hard" magnetic materials instead of "soft" magnetic materials). The fixed magnetic states of the sense layers 112, 122 may enable spin-torque operation at the differential MTJ pair 100 (because spin-torque depends on the relative direction of the magnetic states). Therefore, the differential MTJ pair 100 may enable both STT operation (e.g., using a tunneling effect associated with the tunnel barrier layers 114, 124) and TAS operation (e.g., using an exchange bias effect associated with the AFM layers 118, 128), such as during a write operation at the differential MTJ pair 100. The differential MTJ pair 100 therefore may enable low power STT operation while also achieving stability/reliability associated with TAS designs.

The examples illustrated with reference to FIG. 1 may be implemented within various devices. Certain illustrative example devices that may include the differential MTJ pair 100 are described further with reference to FIGS. 2-6.

Figure 2:
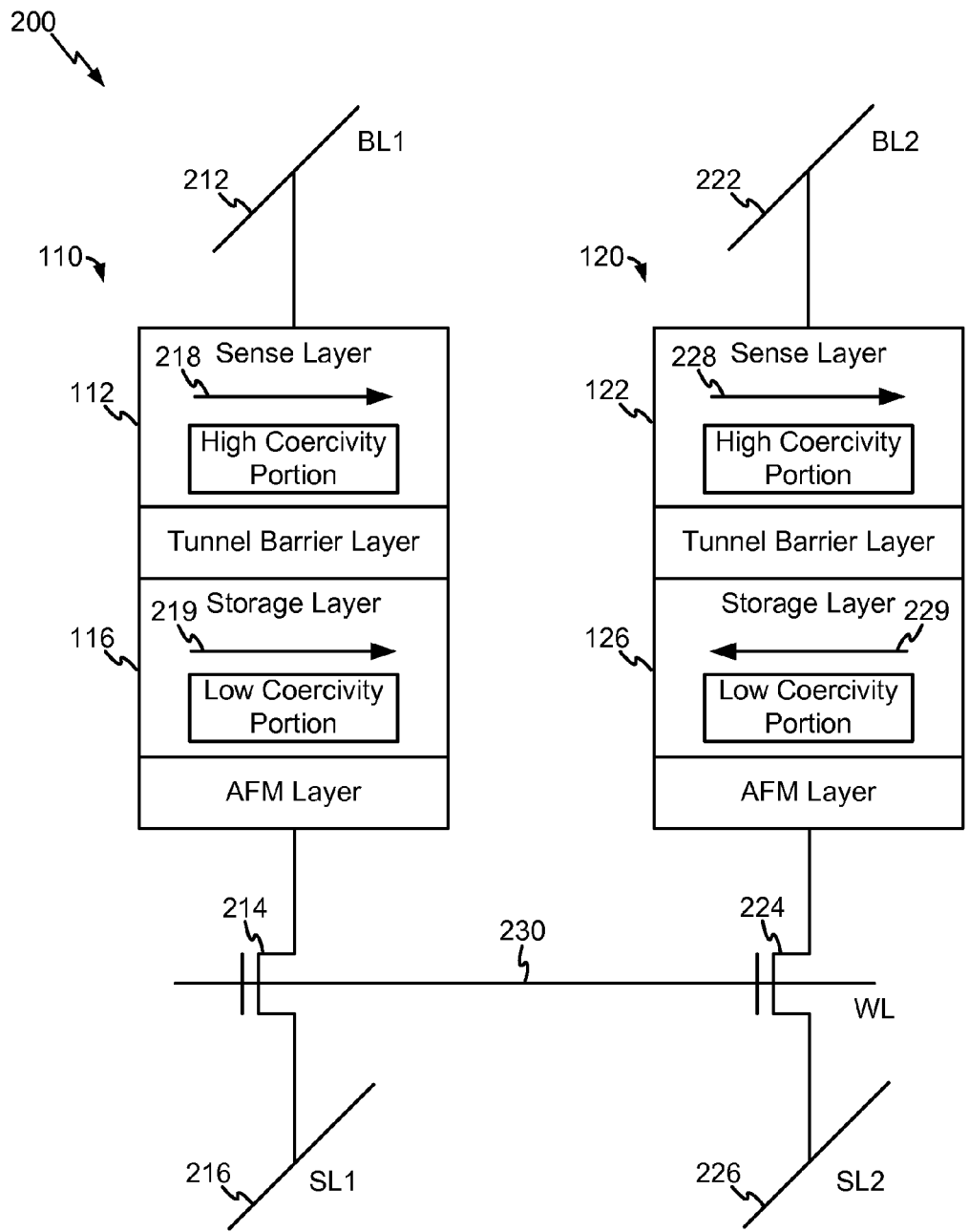
FIG. 2 is a diagram of a particular illustrative embodiment of a device that may include the differential MTJ pair of FIG. 1.

Referring to FIG. 2, a particular illustrative embodiment of a device is depicted and generally designated 200. Certain structures and operations of the device 200 may correspond to one or more structures and operations described with reference to FIG. 1. For example, the device 200 may include the MTJ devices 110, 120.

The device 200 may further include a bit line 212 and a bit line 222. The MTJ device 110 may be coupled to the bit line 212, and the MTJ device 120 may be coupled to the bit line 222.

The device 200 may further include a transistor 214, a transistor 224, and a word line 230. The MTJ device 110 may be coupled to the word line 230 via the transistor 214, and the MTJ device 120 may be coupled to the word line 230 via the transistor 224. For example, drain terminals of the transistors 214, 224 may be coupled to the MTJ devices 110, 120, and gate terminals of the transistors 214, 224 may be coupled to the word line 230.

The device 200 may further include a source line 216 and a source line 226. The MTJ device 110 may be coupled to the source line 216 via the transistor 214, and the MTJ device 120 may be coupled to the source line 226 via the transistor 224. For example, source terminals of the transistors 214, 224 may be coupled to the source lines 216, 226.

In operation, a write operation may be initiated at the device 200 by generating complementary write currents at the MTJ devices 110, 120 while the transistors 214, 224 are activated via a voltage at the word line 230. For example, a first write current may be generated from the bit line 212 to the source line 216, and a second write current may be generated from the source line 226 to the bit line 222 (or vice versa).

The first write current may set a magnetic state 219 (e.g., a magnetic moment) at the storage layer 116. The example of FIG. 2 depicts that the magnetic state 219 of the storage layer 116 may be parallel with respect to a magnetic state 218 (e.g., a magnetic moment) of the sense layer 112, producing a first state (e.g., a low magnetoresistance) of the MTJ device 110.

The second write current may set a magnetic state 229 (e.g., a magnetic moment) at the storage layer 126. The example of FIG. 2 depicts that the magnetic state 229 of the storage layer 126 may be anti-parallel with respect to a magnetic state 228 (e.g., a magnetic moment) of the sense layer 122, producing a second state (e.g., a high magnetoresistance) of the MTJ device 120.

A read operation may be initiated at the device 200 to determine orientations of the magnetic states 219, 229. To illustrate, a first read current may be generated at the MTJ device 110 to determine a first magnetoresistance of the MTJ device 110, and a second read current may be generated at the MTJ device 120 to determine a second magnetoresistance of the MTJ device 120. As an illustrative example, the read currents may be generated by biasing the bit lines 212, 222 with a high voltage and by biasing the source lines 216, 226 with a lower voltage while the transistors 214, 224 are activated by a voltage at the word line 230. The MTJ devices 110, 120 may be associated with either a first value (e.g., a logical "0" value) or a second value (e.g., a logical "1" value) based on a comparison of the first magnetoresistance and the second magnetoresistance. For example, if the second magnetoresistance is greater than the first magnetoresistance, the MTJ devices 110, 120 may be associated with the first value. As another example, if the first magnetoresistance is greater than the second magnetoresistance, the MTJ devices 110, 120 may be associated with the second value.

The example 200 of FIG. 2 illustrates circuitry configured to enable writing and reading of complementary states at the MTJ devices 110, 120. For example, by including multiple bit lines (the bit lines 212, 222) and multiple source lines (the source lines 216, 226) in the device 200, the MTJ devices 110, 120 may be concurrently biased using write currents of different directions (as compared to a device that does not use complementary write currents to write states to a differential MTJ pair). Alternatively, a differential MTJ pair may be connected to a common source line, as described with reference to FIG. 3.

Figure 3:
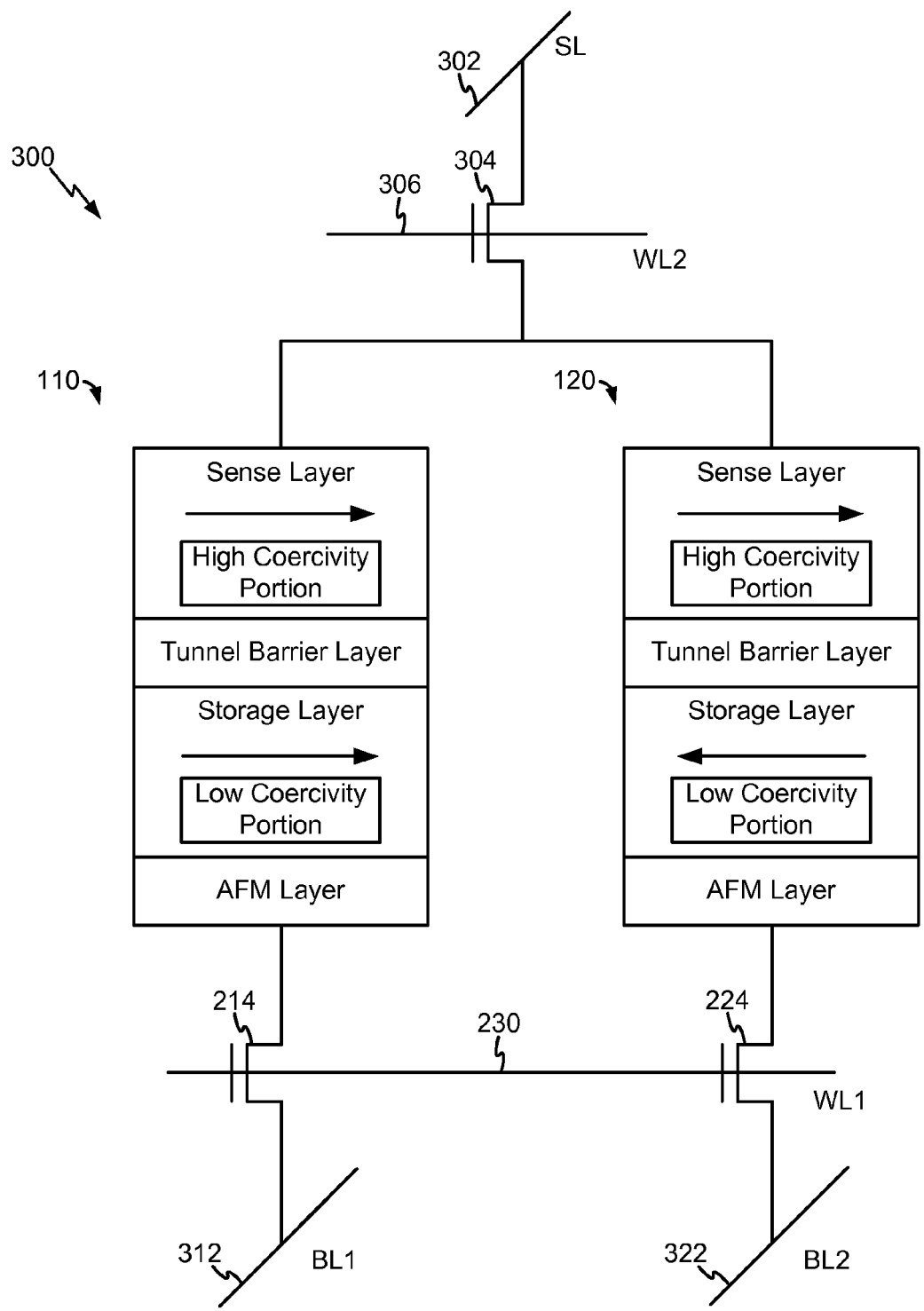
FIG. 3 is a diagram of another particular illustrative embodiment of a device that may include the differential MTJ pair of FIG. 1.

Referring to FIG. 3, a particular illustrative embodiment of a device is depicted and generally designated 300. Certain structures and operations of the device 300 may correspond to one or more structures and operations described with reference to FIGS. 1 and 2. For example, the device 300 may include the MTJ devices 110, 120. The MTJ device 110 may be coupled to the word line 230 via the transistor 214, and the MTJ device 120 may be coupled to the word line 230 via the transistor 224.

The device 300 may further include a source line 302, a transistor 304, and a word line 306. The MTJ devices 110, 120 may be connected to the source line 302 and the word line 306 via the transistor 304. For example, the MTJ devices 110, 120 may be connected to a source terminal of the transistor 304, and the word line 306 may be connected to a gate terminal of the transistor 304. The source line 302 may be connected to a drain terminal of the transistor 304. Thus, in the example of FIG. 3, the MTJ device 110 and the MTJ device 120 are coupled to a common source line (the source line 302) via a common transistor (the transistor 304).

The device 300 may further include a bit line 312 and a bit line 322. The transistor 214 may be connected to the bit line 312, and the transistor 224 may be connected to the bit line 322. For example, a source terminal of the transistor 214 may be connected to the bit line 312, and a source terminal of the transistor 224 may be connected to the bit line 322.

During operation of the device 300, a write operation may be initiated at the MTJ devices 110, 120 by biasing the bit lines 312, 322 using different voltages while the transistors 214, 224 are activated via a voltage at the word line 230. For example, a first voltage may be applied at the bit line 312, and a second voltage (different than the first voltage) may be applied at the bit line 322. The second voltage may be greater than the first voltage to write a first value at the MTJ devices 110, 120, or the first voltage may be greater than the second voltage to generate a second value at the MTJ devices 110, 120. In either case, the MTJ devices 110, 120 may have complementary states after being biased using different voltages (e.g., the MTJ device 110 may have a low magnetoresistance and the MTJ device 120 may have a high magnetoresistance, or vice versa).

The example of FIG. 3 enables "sharing" of a common source line (the source line 302) between the MTJ devices 110, 120. For example, by biasing different voltages at the bit lines 312, 322, complementary states may be set at the MTJ devices 110, 120 in connection with the common source line (the source line 302). The example of FIG. 3 therefore may conserve circuit area in certain applications, which may result in a smaller die size of an integrated circuit that includes the device 300. Alternatively or in addition, one or more structures of the MTJ devices 110, 120 may be included in a common component, as described further with reference to FIG. 4.

Figure 4:
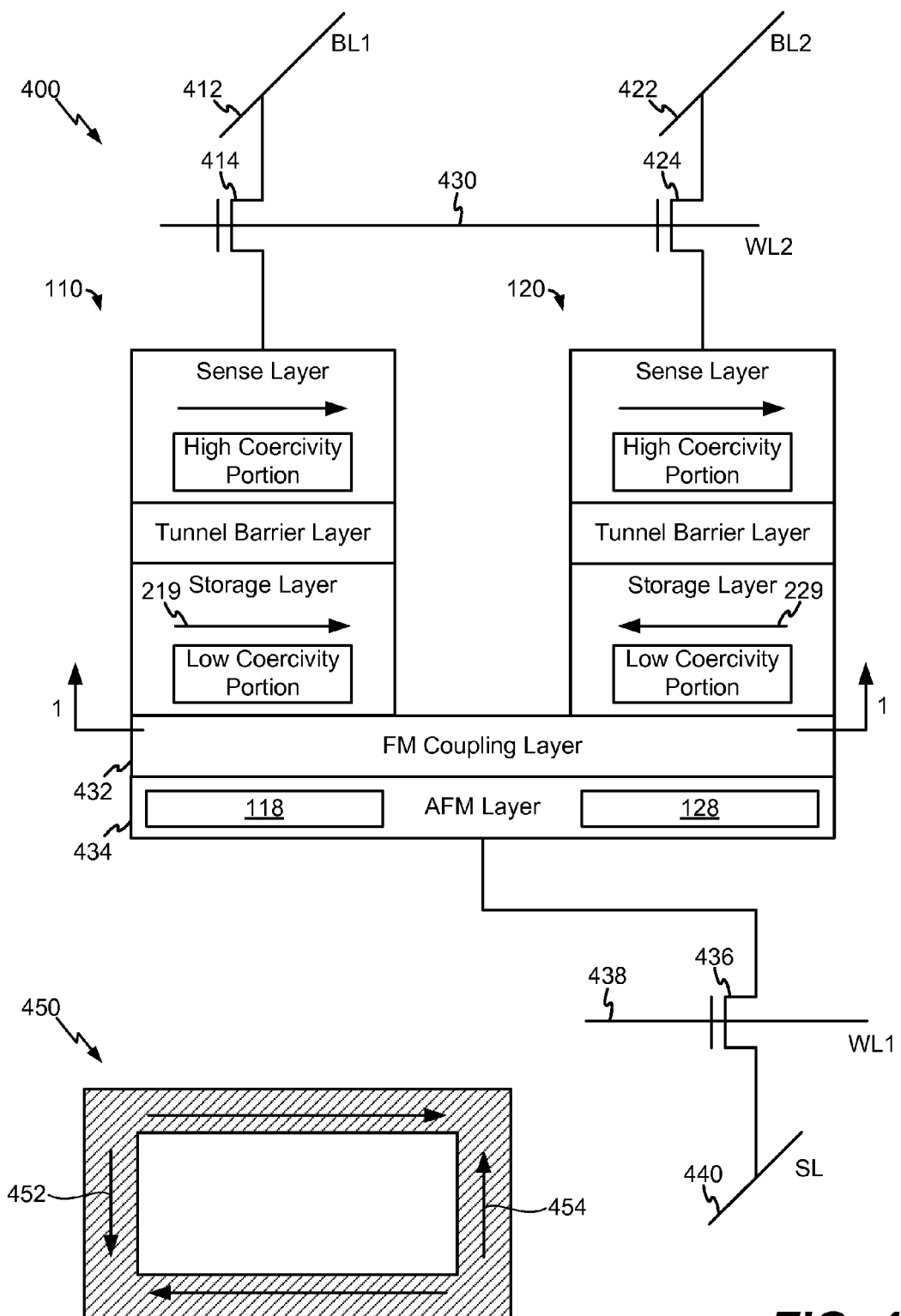
FIG. 4 is a diagram of another particular illustrative embodiment of a device that may include the differential MTJ pair of FIG. 1 and illustrates a cross-sectional view of a region of the device.

Referring to FIG. 4, a particular illustrative embodiment of a device is depicted and generally designated 400. Certain structures and operations of the device 400 may correspond to one or more structures and operations described with reference to FIGS. 1-3. For example, the device 400 may include the MTJ devices 110, 120.

The device 400 may further include a bit line 412 and a transistor 414. The MTJ device 110 may be connected to the bit line 412 via the transistor 414. For example, a source terminal of the transistor 414 may be connected to the MTJ device 110, and a drain terminal of the transistor 414 may be connected to the bit line 412.

The device 400 may further include a bit line 422 and a transistor 424. The MTJ device 120 may be connected to the bit line 422 via the transistor 424. For example, a source terminal of the transistor 424 may be connected to the MTJ device 120, and a drain terminal of the transistor 424 may be connected to the bit line 422.

The device 400 may further include a word line 430. The word line 430 may be connected to the transistors 414, 424. For example, the word line 430 may be connected to gate terminals of the transistors 414, 424.

The device 400 may further include a ferromagnetic (FM) coupling layer 432 and an antiferromagnetic (AFM) layer 434. In an illustrative implementation, the FM coupling layer 432 includes an exchange-bias material, such as Ruthenium (Ru). For example, the FM coupling layer 432 may include approximately 8-9 angstrom (Å) of Ru.

In the example of FIG. 4, the MTJ devices 110, 120 "share" the FM coupling layer 432 and the AFM layer 434. For example, the AFM layer 434 may correspond to a single (e.g., contiguous, monolithic, etc.) region that includes the AFM layers 118, 128. In one or more other configurations (e.g., in the examples of FIGS. 1-3), the AFM layers 118, 128 may correspond to separate regions. In these examples, an AFM layer (e.g., the AFM layer 434) may be etched into the AFM layers 118, 128 using an etch process of a fabrication process, as an illustrative example. Certain illustrative fabrication processes are described further with reference to FIG. 9.

The device 400 may further include a transistor 436, a word line 438, and a source line 440. The MTJ devices 110, 120 may be connected to the word line 438 and to the source line 440 via the transistor 436. For example, the AFM layer 434 may be connected to a drain terminal of the transistor 436, the word line 438 may be connected to a gate terminal of the transistor 436, and the source line 440 may be connected to a source terminal of the transistor 436. Thus, in FIG. 4, the MTJ device 110 and the MTJ device 120 each include a common FM coupling layer (the FM coupling layer 432) and a common AFM layer (the AFM layer 434).

The common AFM layer may be coupled to a common source line (the source line 440) via a common transistor (the transistor 436).

FIG. 4 further illustrates an example cross-sectional view of a region 450 of the device 400 taken across cutting plane 1. In operation, a write current may be applied at the device 400. For example, current may be generated by biasing the source line 440 using a high voltage and by biasing the bit lines 412, 422 using a lower voltage (while voltages at the word lines 430, 438 activate the transistors 414, 424, and 436). In this case, current through the FM coupling layer 432 may generate a magnetic field having field components 452, 454.

The field components 452, 454 may determine orientations (or directions) of the magnetic states 219, 229, resulting in a first value associated with the MTJ devices 110, 120 (e.g., where a magnetoresistance of the MTJ device 120 is greater than a magnetoresistance of the MTJ device 110). In another example, current may be generated in the opposite direction (from the source line 440 to the bit lines 412, 422), which may result in opposite directions of the field components 452, 454, causing the magnetic states 219, 229 to have opposite orientations than illustrated in the example of FIG. 4. In this case, a second value may be associated with the MTJ devices 110, 120 (e.g., where a magnetoresistance of the MTJ device 110 is greater than a magnetoresistance of the MTJ device 120).

The example of FIG. 4 illustrates that certain structures of the MTJ devices 110, 120 may be implemented as a single component or structure. For example, FIG. 4 illustrates that the MTJ devices 110, 120 may "share" the FM coupling layer 432 and the AFM layer 434, which may enable increased density of MTJ devices of an MTJ memory array and/or may reduce a number of fabrication operations (e.g., by avoiding certain etch processes associated with the FM coupling layer 432 and the AFM layer 434 during fabrication of the device 400).

FIGS. 2-4 have been described using in-plane magnetic geometries for convenience of illustration. An in-plane magnetic anisotropy MTJ (iMTJ) may be associated with a first magnetic anisotropy, where a magnetic moment of a layer of the iMTJ is substantially parallel to a surface of the layer. A perpendicular magnetic anisotropy MTJ (pMTJ) may be associated with a second magnetic anisotropy, such as a perpendicular magnetic anisotropy (PMA), where a magnetic moment of a layer of the pMTJ is substantially perpendicular to a surface of the layer. Memory devices including iMTJs may be associated with different performance characteristics (e.g., different switching currents) as compared to memory devices that include pMTJs. It should be appreciated that the MTJ devices 110, 120 may correspond to iMTJ devices or pMTJ devices, depending on the particular implementation. Example configurations for pMTJ devices are described further with reference to FIGS. 5 and 6.

Figure 5:
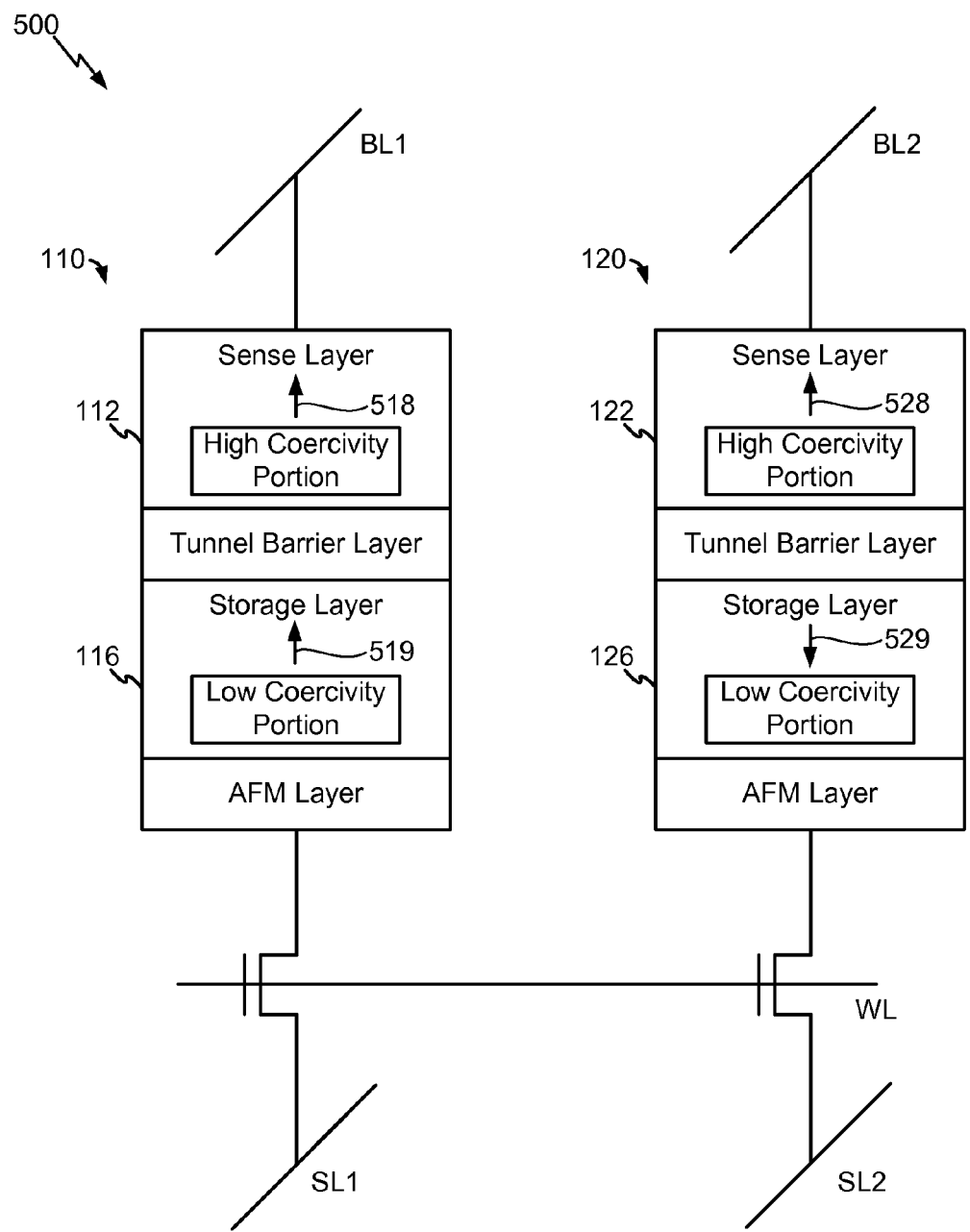
FIG. 5 is a diagram of another particular illustrative embodiment of a device that may include the differential MTJ pair of FIG. 1.

Referring to FIG. 5, a particular illustrative embodiment of a device is depicted and generally designated 500. Certain structures and operations of the device 500 may be as described with reference to FIGS. 1-4. For example, the device 500 may include the MTJ devices 110, 120.

In the example of FIG. 5, the sense layers 112, 122 and the storage layers 116, 126 have perpendicular magnetic anisotropies. For example, materials of the sense layers 112, 122 and the storage layers 116, 126 may have "preferred" magnetic orientations that are perpendicular to a plane, such as a plane corresponding to a surface of a substrate on which the MTJ devices 110, 120 are formed.

The sense layer 112 may have a magnetic state 518, and the sense layer 122 may have a magnetic state 528. The magnetic states 518, 528 may correspond to "fixed" magnetic states. The storage layer 116 may have a magnetic state 519, and the storage layer 126 may have a magnetic state 529. The magnetic states 519, 529 may be complementary (i.e., may have different orientations, as illustrated in the example of FIG. 5). The orientations of the magnetic states 519, 529 illustrated in FIG. 5 may correspond to a first value stored by the MTJ devices 110, 120. The MTJ devices 110, 120 may store a second value when the orientations of the magnetic states 519, 529 are reversed.

The example of FIG. 5 illustrates a differential MTJ pair (the MTJ devices 110, 120) in connection with a perpendicular magnetic anisotropy (PMA) configuration. Depending on the particular application, a PMA configuration may be associated with lower power consumption and enhanced thermal stability as compared to certain in-plane magnetic configurations.

Figure 6:
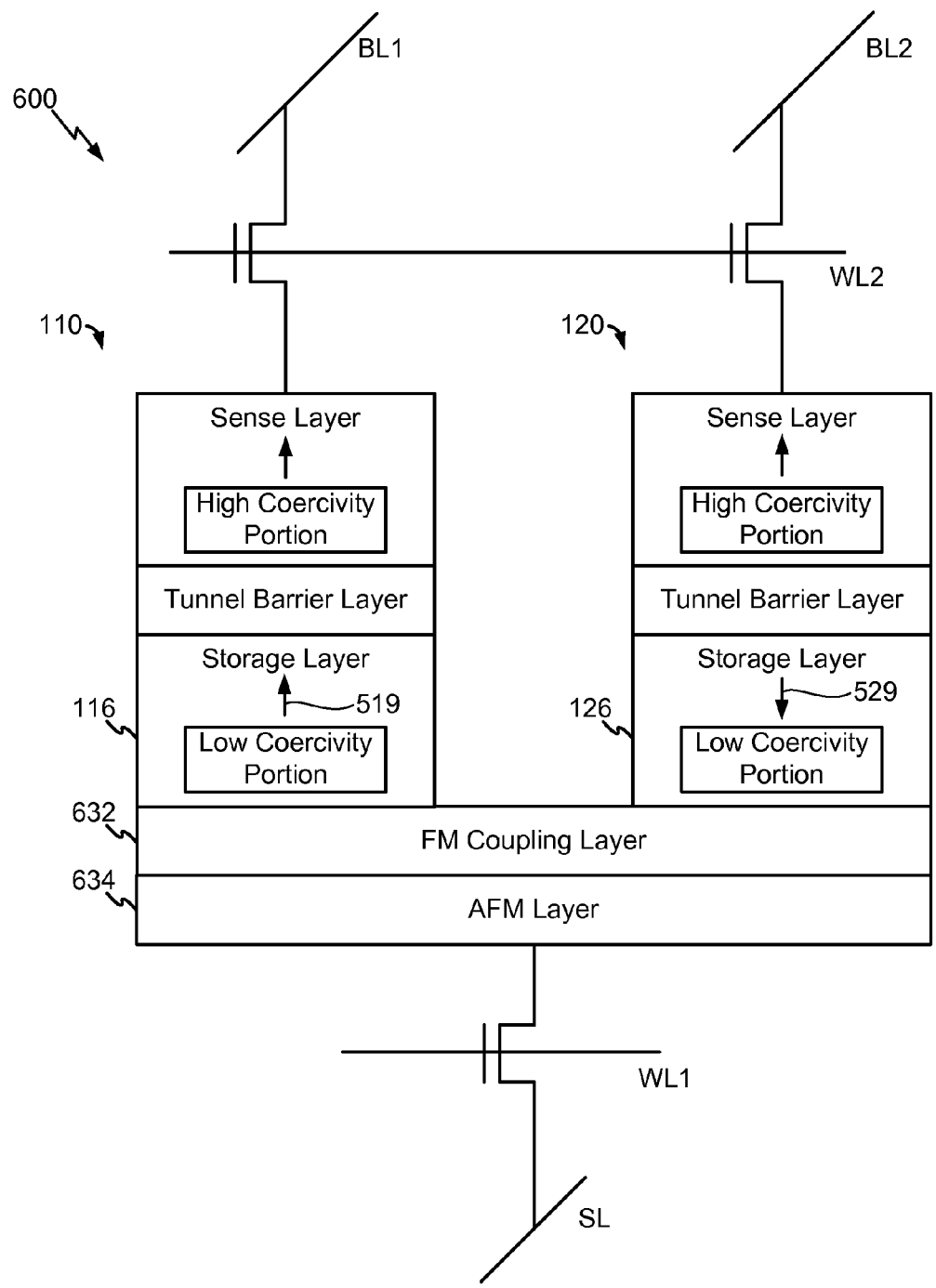
FIG. 6 is a diagram of another particular illustrative embodiment of a device that may include the differential MTJ pair of FIG. 1.

Referring to FIG. 6, a particular illustrative embodiment of a device is depicted and generally designated 600. Certain structures and operations of the device 600 may correspond to one or more structures and operations described with reference to FIGS. 1-5. For example, the device 600 may include the MTJ devices 110, 120.

FIG. 6 illustrates that the MTJ devices 110, 120 may have a PMA configuration in connection with one or more "shared" regions, such as a ferromagnetic (FM) coupling layer 632 and an antiferromagnetic (AFM) layer 634. Structure and operation of the FM coupling layer 632 may be as described with reference to the region 450 of FIG. 4. In the example of FIG. 6, one or more materials of the storage layers 116, 126 may be selected to enable perpendicular magnetic anisotropy (PMA) of the storage layers 116, 126. To illustrate, FIG. 6 depicts that the magnetic states 519, 529 may have an orientation that is perpendicular to surfaces of the storage layers 116, 126.

The example of FIG. 6 illustrates that the MTJ devices 110, 120 may "share" the FM coupling layer 632 and the AFM layer 634. The example of FIG. 6 may therefore enable increased storage density at an MTJ device (e.g., by reducing width between MTJ devices) and reduced manufacturing costs (e.g., by avoiding an etch process to etch the FM coupling layer 632 and/or the AFM layer 634).

Figure 7:
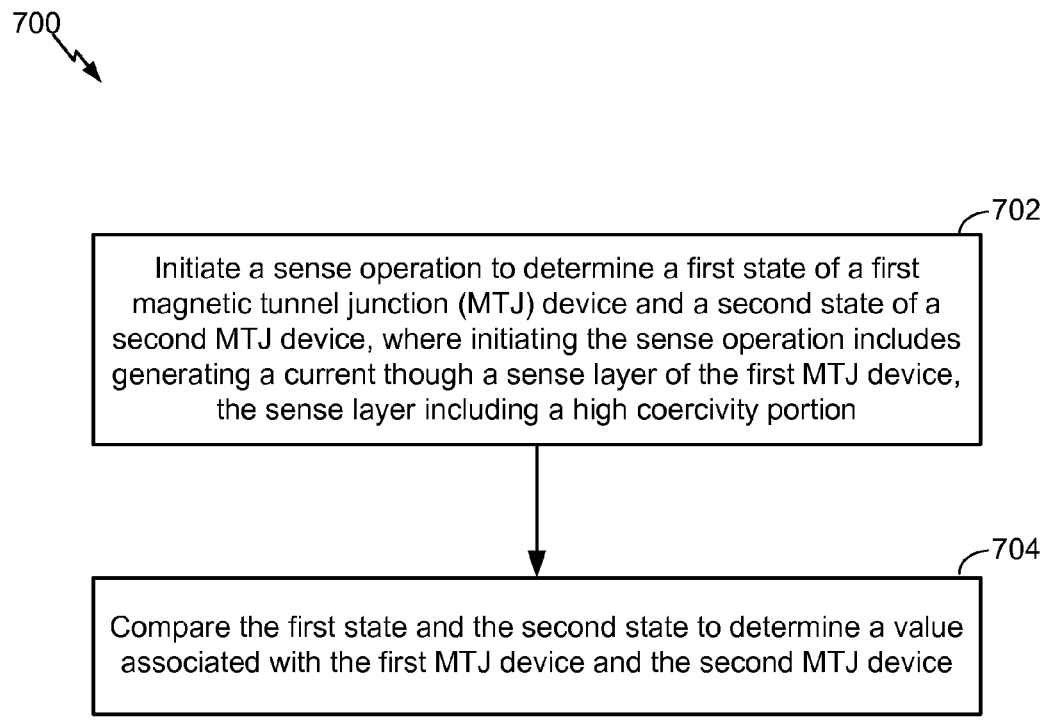
FIG. 7 is a flow diagram of a particular illustrative embodiment of a method of operation of a differential MTJ pair, such as the differential MTJ pair of FIG. 1.

Referring to FIG. 7, a particular embodiment of a method is depicted and generally designated 700. The method 700 may be performed using the differential MTJ pair 100, one or more of the devices 200, 300, 400, 500, and 600, or a combination thereof.

The method 700 includes initiating a sense operation to determine a first state of a first MTJ device and a second state of a second MTJ device, at 702. The first MTJ device may correspond to the MTJ device 110, and the second MTJ device may correspond to the MTJ device 120. Initiating the sense operation may include generating a current though a sense layer of the first MTJ device. The sense layer may include a high coercivity portion. The sense layer may correspond to the sense layer 112 or the sense layer 122, and the high coercivity portion may correspond to the high coercivity portion 111 or the high coercivity portion 121. As an example, the current may be generated by biasing the source line 216 with a high voltage and by biasing the bit line 212 with a lower voltage while the transistor 214 is activated by a voltage at the word line 230, as described with reference to FIG. 2.

A magnitude of the current may indicate a first state of the first MTJ device (e.g., a first magnetoresistance of the MTJ device 110). For example, if the magnitude satisfies a threshold, then the current may indicate that the MTJ device 110 has a low magnetoresistance. Initiating the sense operation may further include generating a second current at the second MTJ device, such as by biasing the source line 226 with a low voltage and by biasing the bit line 222 with a higher voltage while the transistor 224 is activated by a voltage at the word line 230, as described with reference to FIG. 2. A second magnitude of the second current may indicate a second state of the second MTJ device (e.g., a second magnetoresistance of the MTJ device 120). For example, if the second magnitude fails to satisfy a threshold, then the current may indicate that the MTJ device 120 has a high magnetoresistance.

The method 700 further includes comparing the first state and the second state to determine a value associated with the first MTJ device and the second MTJ device, at 704. A difference between the first state and the second state may indicate a value associated with a differential MTJ pair that includes the first MTJ device and the second MTJ device. To illustrate, the first state may correspond to a first magnetoresistance of the first MTJ device, the second state may correspond to a second magnetoresistance of the second MTJ device, and the difference may indicate whether the first magnetoresistance is greater than the second magnetoresistance. The value may correspond to a particular bit value, such as a logical zero bit value, if the second magnetoresistance is greater than the first magnetoresistance. The value may correspond to another bit value, such as a logical one bit value, if the first magnetoresistance is greater than the second magnetoresistance.

Prior to initiating the sense operation, the method 700 may further include writing the value to the differential MTJ pair by generating the first state at the first MTJ device and by generating the second state at the second MTJ device. For example, write currents may be applied to the MTJ devices 110, 120 to set complementary states at the differential MTJ pair 100, as described with reference to FIG. 1.

The method 700 may enable improved operation at an MRAM device. For example, because a magnetic state of a sense layer need not be "toggled" during sense operations as in certain self-referenced MTJ designs, the sense layer may include a high coercivity portion, such as the high coercivity portion 111. The high coercivity portion may have a stable or "fixed" magnetic state. Accordingly, latency of a sense operation is reduced, and stability is increased as compared to an MTJ device that includes a "soft" sense layer that can change states in response to noise, interference, etc.

The method 700 may be performed at an electronic device that includes MTJ devices. The electronic device may include a magnetoresistive random access memory (MRAM) device, such as an MRAM memory array of differential MTJ pairs that each correspond to the differential MTJ pair 100 of FIG. 1. In an illustrative implementation, the method 700 is performed by control circuitry of a thermal-assisted switching spin-torque transfer magnetoresistive random access memory (TAS-STT MRAM) device, as described further with reference to FIG. 8.

Figure 8:
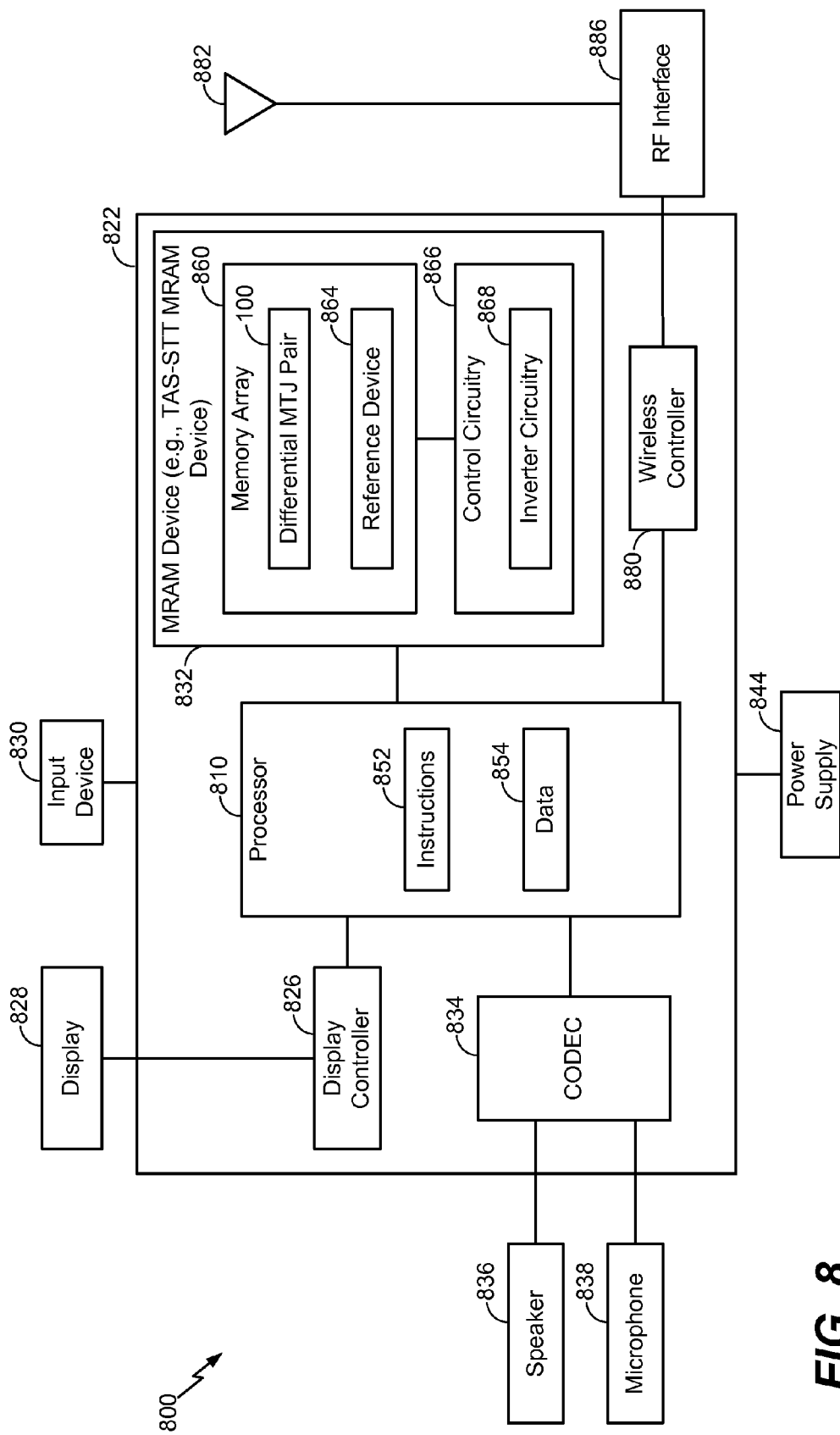
FIG. 8 is a block diagram of an electronic device that includes a differential MTJ pair, such as the differential MTJ pair of FIG. 1.

Referring to FIG. 8, a block diagram of a particular illustrative embodiment of an electronic device is depicted and generally designated 800. In a particular embodiment, the electronic device 800 corresponds to a mobile device that is configured to communicate via a wireless communications network.

The electronic device 800 includes a processor 810, such as a digital signal processor (DSP). The processor 810 may be coupled to a memory, such as to a magnetoresistive random access memory (MRAM) device 832. The MRAM device 832 may include a memory array 860 that includes a plurality of differential MTJ pairs, such as the differential MTJ pair 100 of FIG. 1. The memory array 860 may further include a reference device 864. The MRAM device 832 may further include control circuitry 866. The control circuitry 866 may include inverter circuitry 868, such as one or more complementary metal-oxide-semiconductor (CMOS) inverters. In a particular embodiment, the MRAM device 832 corresponds to a TAS-STT MRAM device. It should be appreciated that one of the devices 200, 300, 400, 500, and 600 may be implemented within the MRAM device 832.

The processor 810 may read and write instructions 852 and/or data 854 at the MRAM device 832. For example, the processor 810 may cause the control circuitry 866 to store the instructions 852 and/or the data 854 to the memory array 860. As another example, the processor 810 may cause the control circuitry 866 to read the instructions 852 and/or the data 854 from the memory array 860. The control circuitry 866 may be configured to initiate or control one or more operations described with reference to FIGS. 1-7, such as operations of the method 700. For example, the control circuitry 866 may include a sense amplifier configured to compare a first current indicating a first state of the MTJ device 110 of FIG. 1 and a second current indicating a second state of the MTJ device 120 of FIG. 1 to determine a value stored by the differential MTJ pair 100.

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834. FIG. 8 further indicates that a wireless controller 880 can be coupled to the processor 810. The wireless controller 880 may be further coupled to an antenna 882 via a radio frequency (RF) interface 886.

In a particular embodiment, the processor 810, the display controller 826, the MRAM device 832, the CODEC 834, and the wireless controller 880 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the antenna 882, the power supply 844, and the RF interface 886 are external to the system-on-chip device 822. However, each of the display 828, the input device 830, the speaker 836, the microphone 838, the antenna 882, the power supply 844, and the RF interface 886 can be coupled to a component of the system-on-chip device 822, such as to an interface or to a controller.

The reference device 864 and the inverter circuitry 868 may enable data recovery at the MRAM device 832. To illustrate, if an MRAM device is subject to a strong external magnetic field, one or more magnetic states of MTJs of the MRAM device may be altered (or "flipped"). TAS-MRAM devices typically provide high stability and protection against external magnetic fields because MTJs must be heated to change states of storage layers. However, a strong magnetic field may in some cases alter states of sense layers of MTJs, resulting in data corruption. To illustrate, if a strong magnetic field causes the magnetic states 218, 228 of FIG. 2 to "flip," then a state of the MTJ devices 110, 120 may change (e.g., from a logical "1" value to a logical "0" value, because the MTJ device 110 would have a greater resistance than the MTJ device 120).

The reference device 864 may be configured to store a reference state (e.g., a sample state, such as a reference magnetoresistance that is known to the control circuitry 866). For example, the reference device 864 may include one or more differential MTJ pairs indicating sample states (e.g., instead of states associated with user data). During operation of the electronic device 800, the control circuitry 866 may be configured to access the reference device 864 to detect the reference state. If the control circuitry 866 detects a change in the reference state (e.g., that the reference state has "flipped"), then the MRAM device 832 may have been subject to a strong magnetic field that has altered magnetic states of MTJ devices of the memory array 860 (e.g., the differential MTJ pair 100).

In response to detecting a change in the reference state, the control circuitry 866 may be configured to invert values read from the memory array 860 (i.e., to compensate for "flipping" of the states in response to application of a strong magnetic field at the MRAM device 832). The inverter circuitry 868 may invert each value read from the memory array 860 (e.g., from a logical "0" bit value to a logical "1" bit value, and vice versa) to generate inverted values. The MRAM device 832 may provide the inverted values to the processor 810, such as in response to a read request from the processor 810 for data or instructions stored at the memory array 860, as an illustrative example.

The example of FIG. 8 illustrates simplified data recovery for an MRAM device that utilizes differential MTJ pairs. To illustrate, if the reference state of the reference device 864 changes, then the control circuitry 866 may determine that the MRAM device 832 has been subject to a strong external magnetic field. In this case, the control circuitry 866 may use the inverter circuitry 868 to generate a complement of data read from the memory array 860 to "restore" the data. Therefore, the reference device 864 and the inverter circuitry 868 may enable recovery of data after application of a strong magnetic field at the MRAM device 832.

Although the examples of FIG. 8 have been illustrated with reference to the electronic device 800, it should be appreciated that the techniques of FIG. 8 may be implemented at one or more other devices. For example, the reference device 864 and the inverter circuitry 868 can be implemented within a radio frequency identification (RFID) device, as an illustrative example. Thus, the examples of FIG. 8 may improve data reliability and may enable recovery of data after data corruption resulting from a strong magnetic field, such as in connection with a "denial of service" (DoS) attack.

In conjunction with the described embodiments, a magnetoresistive random access memory (MRAM) device (e.g., the MRAM device 832) includes a plurality of differential MTJ pairs (e.g., the memory array 860). The plurality of differential MTJ pairs includes a differential MTJ pair (e.g., the differential MTJ pair 100) having a sense layer (e.g., the sense layer 112 or the sense layer 122) that includes a high coercivity portion (e.g., the high coercivity portion 111 or the high coercivity portion 121). The MRAM device further includes a reference device, such as the reference device 864. The reference device is configured to store a sample state to enable data recovery in response to exposure of the MRAM device to a strong magnetic field.

In conjunction with the described embodiments, an apparatus includes means for storing a first magnetic state of a differential magnetic tunnel junction (MTJ) pair and means for storing a second magnetic state of the differential MTJ pair. The means for storing the first magnetic state may correspond to the MTJ device 110, the means for storing the second magnetic state may correspond to the MTJ device 120, and the differential MTJ pair may correspond to the differential MTJ pair 100. The means for storing the first magnetic state includes a sense layer having a high coercivity portion. The sense layer may correspond to the sense layer 112 or the sense layer 122, and the high coercivity portion may correspond to the high coercivity portion 111 or the high coercivity portion 121.

In conjunction with the described embodiments, a computer-readable medium (e.g., the memory array 860) stores instructions (e.g., the instructions 852) that are executable by a processor (e.g., the processor 810). The computer-readable medium includes a first magnetic tunnel junction (MTJ) device of a differential MTJ pair and a second magnetic tunnel junction (MTJ) device of the differential MTJ pair. The first MTJ device may correspond to the MTJ device 110, the second MTJ device may correspond to the MTJ device 120, and differential MTJ pair may correspond to the differential MTJ pair 100. The first MTJ device includes a sense layer having a high coercivity portion. The sense layer may correspond to the sense layer 112 or the sense layer 122, and the high coercivity portion may correspond to the high coercivity portion 111 or the high coercivity portion 121. In an illustrative implementation, a difference between a first state of the first MTJ device and a second state of the second MTJ device indicates a single bit value. For example, the first state may correspond to a first magnetoresistance of the MTJ device 110, the second state may correspond to a second magnetoresistance of the MTJ device 120, and the difference may indicate whether the first magnetoresistance is greater than the second magnetoresistance. In a particular embodiment, the computer-readable medium includes an array of differential MTJ pairs, and each of the differential MTJ pairs stores a respective bit value (e.g., of the instructions 852).

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include wafers (e.g., semiconductor wafers) that are then cut into die and packaged into chips. The chips are then employed in devices described above (e.g., within the electronic device 800), as described further with reference to FIG. 9.

Figure 9:
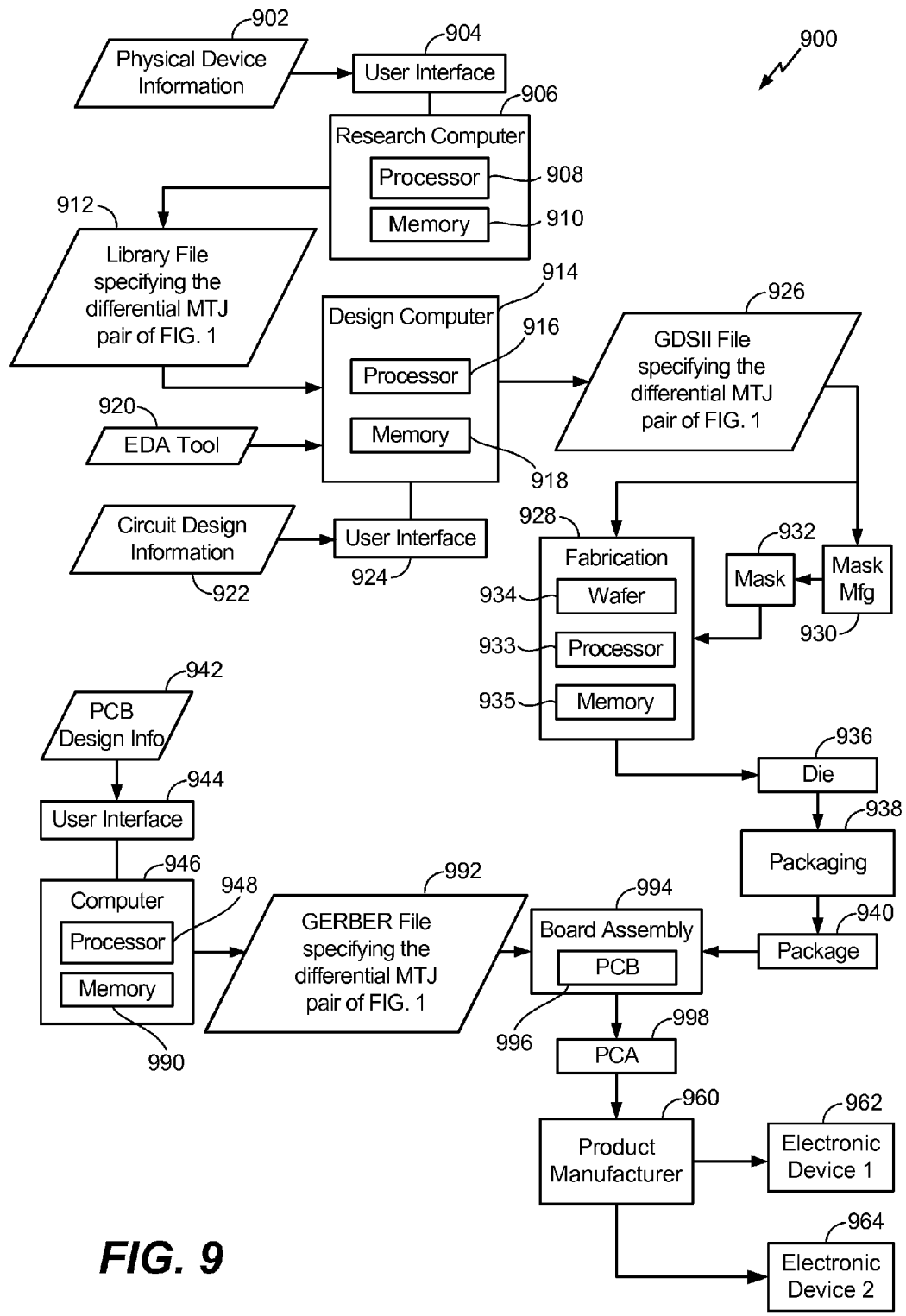
FIG. 9 is a data flow diagram of a particular illustrative embodiment of a manufacturing process to manufacture electronic devices that include a differential MTJ pair, such as the differential MTJ pair of FIG. 1.

FIG. 9 depicts a particular illustrative embodiment of an electronic device manufacturing process 900. Physical device information 902 is received at the manufacturing process 900, such as at a research computer 906. The physical device information 902 may include design information representing at least one physical property of a semiconductor device, such as the differential MTJ pair 100, one or more of the devices 200, 300, 400, 500, and 600, and/or the system-on-chip device 822. For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may specify a library of semiconductor devices that indicates the differential MTJ pair 100, one or more of the devices 200, 300, 400, 500, and 600, and/or the system-on-chip device 822. The library file 912 may be utilized in connection with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit of the library file 912. The circuit may include the differential MTJ pair 100, one or more of the devices 200, 300, 400, 500, and 600, and/or the system-on-chip device 822. For example, a user of the design computer 914 may enter circuit design information 922 via a user interface 924 coupled to the design computer 914. The circuit design information 922 may include design information representing at least one physical property of a semiconductor device, such as the differential MTJ pair 100, one or more of the devices 200, 300, 400, 500, and 600, and/or the system-on-chip device 822. To illustrate, the circuit design information 922 may identify particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the differential MTJ pair 100, one or more of the devices 200, 300, 400, 500, and 600, and/or the system-on-chip device 822, in addition to other circuits or information. To illustrate, the data file may include information corresponding to a system-on-chip (SoC) that includes the differential MTJ pair 100 and/or one or more of the devices 200, 300, 400, 500, and 600, and that also includes additional electronic circuits and components within the SoC. The SoC may correspond to the system-on-chip device 822.

The GDSII file 926 may be received at a fabrication process 928 to manufacture the differential MTJ pair 100, one or more of the devices 200, 300, 400, 500, and 600, and/or the system-on-chip device 822 according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 may include the differential MTJ pair 100, one or more of the devices 200, 300, 400, 500, and 600, and/or the system-on-chip device 822.

To further illustrate, a processor 933 and a memory 935 may initiate and/or control the fabrication process 928. The memory 935 may include executable instructions such as computer-readable instructions or processor-readable instructions. The executable instructions may include one or more instructions that are executable by a processor, such as the processor 933.

The fabrication process 928 may be implemented by a fabrication system that is fully automated or partially automated. For example, the fabrication process 928 may be automated according to a schedule. The fabrication system may include fabrication equipment (e.g., processing tools) to perform one or more operations to form a device, such as an MRAM device. For example, the fabrication equipment may be configured to deposit one or more materials, epitaxially grow one or more materials, conformally deposit one or more materials, apply a hardmask, apply an etching mask, perform etching, perform planarization, form an MTJ stack, and/or perform a wafer cleaning process, etc.

The fabrication system (e.g., an automated system that performs the fabrication process 928) may have a distributed architecture (e.g., a hierarchy). For example, the fabrication system may include one or more processors, such as the processor 933, one or more memories, such as the memory 935, and/or one or more controllers that are distributed according to the distributed architecture. The distributed architecture may include a high-level processor that controls or initiates operations of one or more low-level systems. For example, a high-level processor may include one or more processors, such as the processor 933, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 933.

Alternatively, the processor 933 may be a part of a high-level system, subsystem, or component of the fabrication system. In another embodiment, the processor 933 initiates or controls distributed processing operations associated with multiple levels and components of a fabrication system.

Thus, the processor 933 may include processor-executable instructions that, when executed by the processor 933, cause the processor 933 to initiate or control formation of a device. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard clean 1 type removal tool.

The executable instructions included in the memory 935 may enable the processor 933 to initiate or control formation of a device or structure described herein. For example, the executable instructions may enable the processor 933 to initiate or control formation of the differential MTJ pair 100, one or more of the devices 200, 300, 400, 500, and 600, and/or the system-on-chip device 822. The die 936 may include the differential MTJ pair 100, one or more of the devices 200, 300, 400, 500, and 600, and/or the system-on-chip device 822.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 990. A printed circuit board (PCB) tool may be stored as processor executable instructions at the memory 990 to process PCB design information 942 received from a user of the computer 946 via a user interface 944. The PCB design information 942 may include physical positioning information of a packaged semiconductor device on a circuit board. The packaged semiconductor device may correspond to the package 940. One or more semiconductor devices may be integrated within the package 940. For example, the differential MTJ pair 100, one or more of the devices 200, 300, 400, 500, and 600, and/or the system-on-chip device 822 may be integrated within the package 940.

The computer 946 may be configured to transform the PCB design information 942 to generate a data file, such as a GERBER file 992, with data that includes physical positioning information of a packaged semiconductor device on a circuit board, as well as layout of electrical connections such as traces and vias. The packaged semiconductor device may correspond to the package 940 and may include the differential MTJ pair 100, one or more of the devices 200, 300, 400, 500, and 600, and/or the system-on-chip device 822. In other embodiments, the data file generated by the transformed PCB design information may have a format other than a GERBER format.

The GERBER file 992 may be received at a board assembly process 994 and may be used to create PCBs, such as a representative PCB 996, manufactured in accordance with the design information stored within the GERBER file 992. For example, the GERBER file 992 may be uploaded to one or more machines to perform various steps of a PCB production process. The PCB 996 may be populated with electronic components including the package 940 to form a representative printed circuit assembly (PCA) 998.

The PCA 998 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a mobile device, a computer, a set top box, a music player, a video player, an entertainment unit, a navigation device, a communications device, a personal digital assistant (PDA), or a fixed location data unit, into which the differential MTJ pair 100, one or more of the devices 200, 300, 400, 500, and 600, and/or the system-on-chip device 822 is integrated. As another illustrative, non-limiting example, one or more of the electronic devices 962 and 964 may include mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. It should be appreciated that the disclosure is not limited to these illustrated devices.

Accordingly, a device that includes the differential MTJ pair 100, one or more of the devices 200, 300, 400, 500, and 600, and/or the system-on-chip device 822 may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 992, as well as stored at the memory 910 of the research computer 906, the memory 918 of the design computer 914, the memory 990 of the computer 946, the memory of one or more other computers or processors (not shown) used at the various stages, such as at the board assembly process 994, and also incorporated into one or more other physical embodiments such as the mask 932, the die 936, the package 940, the PCA 998, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. As an illustrative example, operations of the method 700 of FIG. 7 may be implemented using hardware, such using the control circuitry 866 of FIG. 8. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a first magnetic tunnel junction (MTJ) device of a differential MTJ pair; and
    a second MTJ device of the differential MTJ pair,
    wherein the first MTJ device comprises an antiferromagnetic (AFM) layer, a storage layer having a low coercivity portion, and a sense layer having a high coercivity portion, the storage layer positioned between the AFM layer and the sense layer.

2. The apparatus of claim 1, wherein a difference between a first state of the first MTJ device and a second state of the second MTJ device indicates a value associated with the differential MTJ pair.

3. The apparatus of claim 2, wherein the first state comprises a first magnetoresistance of the first MTJ device, wherein the second state comprises a second magnetoresistance of the second MTJ device, and wherein the difference indicates whether the first magnetoresistance is greater than the second magnetoresistance.

4. The apparatus of claim 1, wherein the first MTJ device further comprises a tunnel barrier layer on the storage layer, wherein the tunnel barrier layer is positioned between the sense layer and the AFM layer.

5. The apparatus of claim 1, wherein the high coercivity portion has a first coercivity of greater than 1000 oersted (Oe), and wherein the low coercivity portion has a second coercivity of less than 100 Oe.

6. The apparatus of claim 1, wherein the high coercivity portion comprises a cobalt/iron/boron (Co/Fe/B) material, and wherein the low coercivity portion comprises an iron/nickel (Fe/Ni) material.

7. The apparatus of claim 1, wherein the first MTJ device is coupled to a first source line via a first transistor, and wherein the second MTJ device is coupled to a second source line via a second transistor.

8. The apparatus of claim 1, wherein the first MTJ device and the second MTJ device are coupled to a common source line via a common transistor.

9. The apparatus of claim 1, wherein the first MTJ device and the second MTJ device each comprise a common ferromagnetic (FM) coupling layer, and wherein the second MTJ device comprises the AFM layer.

10. The apparatus of claim 9, wherein the AFM layer is coupled to a common source line via a common transistor.

11. The apparatus of claim 1, wherein the first MTJ device and the second MTJ device each correspond to in-plane magnetic anisotropy magnetic tunnel junction (iMTJ) devices.

12. The apparatus of claim 1, wherein the first MTJ device and the second MTJ device each correspond to perpendicular magnetic anisotropy magnetic tunnel junction (pMTJ) devices.

13. The apparatus of claim 1, further comprising a magnetoresistive random access memory (MRAM) device that comprises the first MTJ device and the second MTJ device.

14. The apparatus of claim 13, wherein the MRAM device comprises a thermal-assisted switching spin-torque transfer (TAS-STT) MRAM device.

15. The apparatus of claim 13, wherein the MRAM device comprises control circuitry configured to compare a first current indicating a first state of the first MTJ device and a second current indicating a second state of the second MTJ device to determine a value stored by the differential MTJ pair.

16. The apparatus of claim 15, wherein the MRAM device comprises a reference device configured to store a reference state, wherein the control circuitry is configured to access the reference device to determine the reference state, and wherein the control circuitry comprises inverter circuitry configured to invert the value in response to a change in the reference state.

17. The apparatus of claim 16, wherein inversion of the value enables data recovery in response to exposure of the MRAM device to a strong magnetic field.

18. The apparatus of claim 1, further comprising an electronic device selected from a mobile device, a computer, a set top box, a music player, a video player, an entertainment unit, a navigation device, a communications device, a personal digital assistant (PDA), or a fixed location data unit, wherein the differential MTJ pair is integrated within the electronic device.

19. A method comprising:
    initiating a sense operation to determine whether a first magnetic tunnel junction (MTJ) device is in a first state or a second state and whether a second MTJ device is in the first state or the second state, wherein initiating the sense operation comprises generating a current though a sense layer of the first MTJ device, the sense layer comprising a high coercivity portion; and
    comparing the first state and the second state to determine a value associated with the first MTJ device and the second MTJ device,
        wherein the value corresponds to a first logical bit value if the first MTJ device is in the first state and the second MTJ device is in the second state, and
        wherein the value corresponds to a second logical bit value if the first MTJ device is in the second state and the second MTJ device is in the first state.

20. The method of claim 19, wherein initiating the sense operation further comprises generating a second current at the second MTJ device.

21. The method of claim 19, further comprising, prior to initiating the sense operation, writing the value at a differential MTJ pair that includes the first MTJ device and the second MTJ device.

22. The method of claim 19, wherein the first state corresponds to a first magnetoresistance, and wherein the second state corresponds to a second magnetoresistance.

23. The method of claim 19, performed by control circuitry of a thermal-assisted switching spin-torque transfer magnetoresistive random access memory (TAS-STT MRAM) device that comprises the first MTJ device and the second MTJ device.

24. An apparatus comprising:
    means for storing a first magnetic state of a differential magnetic tunnel junction (MTJ) pair; and
    means for storing a second magnetic state of the differential MTJ pair,
    wherein the means for storing the first magnetic state comprises an antiferromagnetic (AFM) layer, a storage layer having a low coercivity portion, and a sense layer having a high coercivity portion, the storage layer positioned between the AFM layer and the sense layer.

25. The apparatus of claim 24, wherein a difference between the first magnetic state and the second magnetic state indicates a value associated with the differential MTJ pair.

26. The apparatus of claim 24, further comprising an electronic device selected from a mobile device, a computer, a set top box, a music player, a video player, an entertainment unit, a navigation device, a communications device, a personal digital assistant (PDA), or a fixed location data unit, wherein the differential MTJ pair is integrated within the electronic device.

27. An apparatus comprising:
a first magnetic tunnel junction (MTJ) device of a differential MTJ pair; and
a second MTJ device of the differential MTJ pair, wherein the first MTJ device comprises a sense layer having a high coercivity portion, and
wherein:
the first MTJ device further comprises a storage layer having a low coercivity portion, the high coercivity portion having a first coercivity of greater than 1000 oersted (Oe) and the low coercivity portion having a second coercivity of less than 100 Oe,
the first MTJ device and the second MTJ device are coupled to a common source line via a common transistor, or
the first MTJ device and the second MTJ device each comprise a common ferromagnetic (FM) coupling layer and a common antiferromagnetic (AFM) layer, or any combination thereof.

28. The apparatus of claim 27, wherein a difference between a first state of the first MTJ device and a second state of the second MTJ device indicates a single bit value, wherein the first state corresponds to a first magnetoresistance of the first MTJ device, wherein the second state corresponds to a second magnetoresistance of the second MTJ device, and wherein the difference indicates whether the first magnetoresistance is greater than the second magnetoresistance.

29. The apparatus of claim 1, wherein the storage layer is in contact with the AFM layer.

30. The apparatus of claim 4, wherein the sense layer is in contact with the tunnel barrier layer.

* * * * *